United States Patent [19]

Ichimura

[11] 4,076,362

[45] Feb. 28, 1978

[54] CONTACT DRIVER

[75] Inventor: Yoshiaki Ichimura, Akishima, Japan

[73] Assignee: Japan Aviation Electronics Industry Ltd., Tokyo, Japan

[21] Appl. No.: 767,845

[22] Filed: Feb. 11, 1977

[30] Foreign Application Priority Data

| | | |
|---|---|---|
| Feb. 20, 1976 | Japan | 51-16910 |
| Nov. 1, 1976 | Japan | 51-131361 |
| May 24, 1976 | Japan | 51-66389[U] |

[51] Int. Cl.[2] ........................ H01R 13/54; H05K 1/10

[52] U.S. Cl. ........................ 339/75 MP; 339/176 MP

[58] Field of Search ........ 339/75 MP, 75 M, 176 MP

[56] References Cited

U.S. PATENT DOCUMENTS

| | | | |
|---|---|---|---|
| 3,022,481 | 2/1962 | Stepoway | 339/75 MP |
| 3,568,134 | 3/1971 | Anhalt et al. | 339/75 MP |

OTHER PUBLICATIONS

Twin-Contact Connector, Colletti et al., IBM Technical Disclosure Bulletin, vol. 14, No. 9, Feb. 1972, pp. 2097-2098.

Zero Insertion Force Connector, Gustafson, IBM Technical Disclosure Bulletin, vol. 13, No. 7, Dec. 1970, p. 2048.

*Primary Examiner*—Roy Lake
*Assistant Examiner*—E. F. Desmond
*Attorney, Agent, or Firm*—Hammond & Littell

[57] ABSTRACT

Discloses novel contact drivers in electric connectors. The electric connectors respectively provided with a series of contacts each of which has a movable end. Pin conductors are inserted into positions in which the pin conductors remain out of contact with the contacts. By operating a slider which is slidable longitudinally along the connector, the movable ends of the contacts are brought into contact with the pin conductors.

12 Claims, 28 Drawing Figures

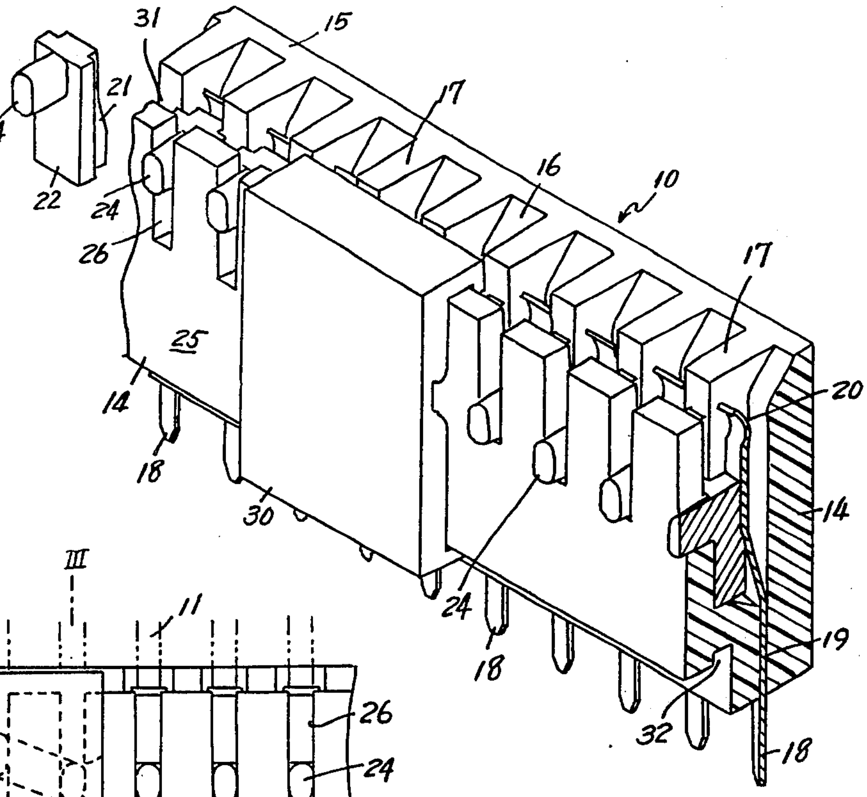
Fig. 1.
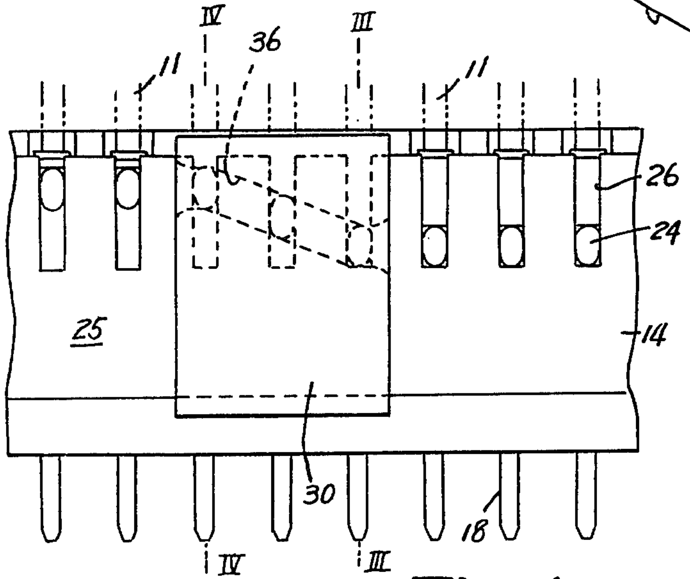
Fig. 2.
Fig. 3.
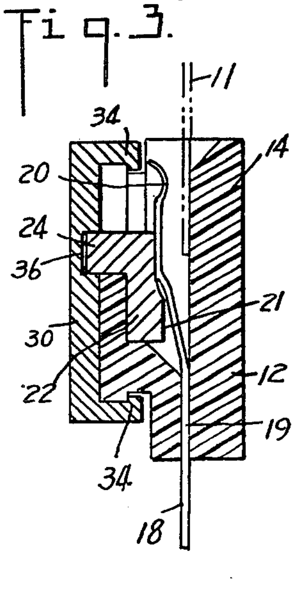
Fig. 4.
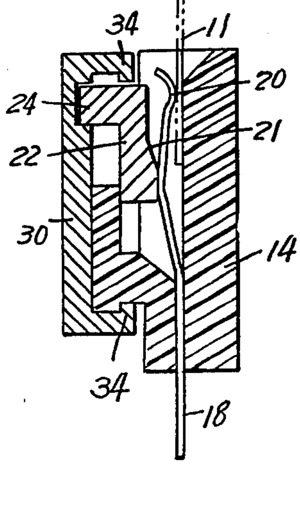
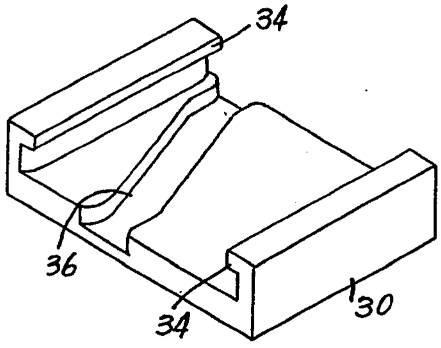
Fig. 5.

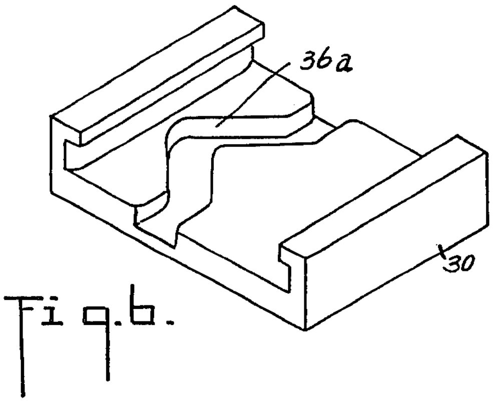
Fig. 6.
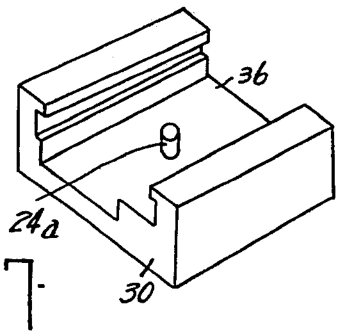
Fig. 7.
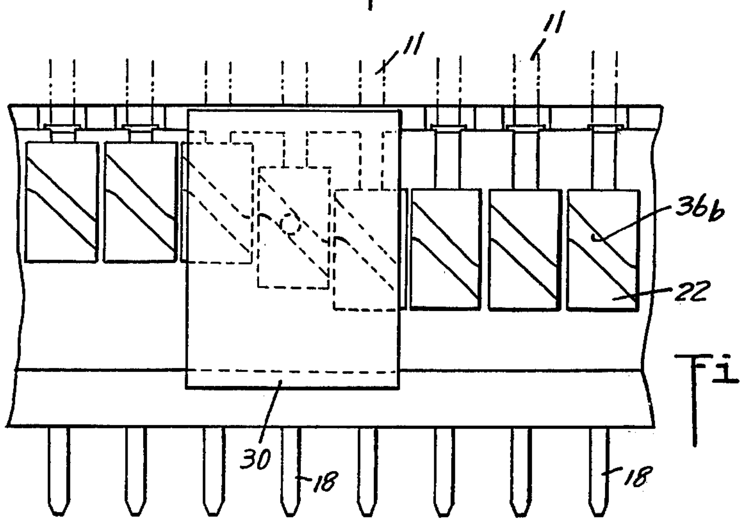
Fig. 8.
Fig. 9.
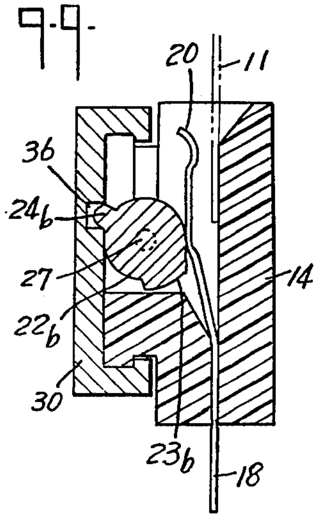
Fig. 10.
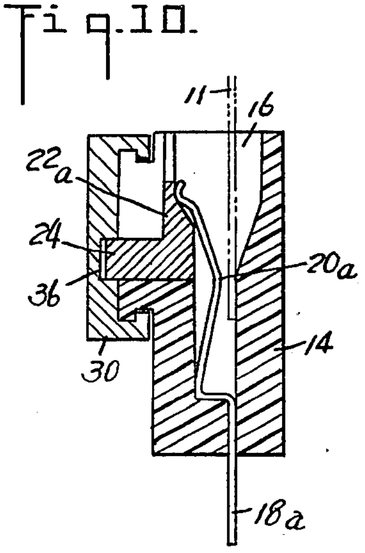

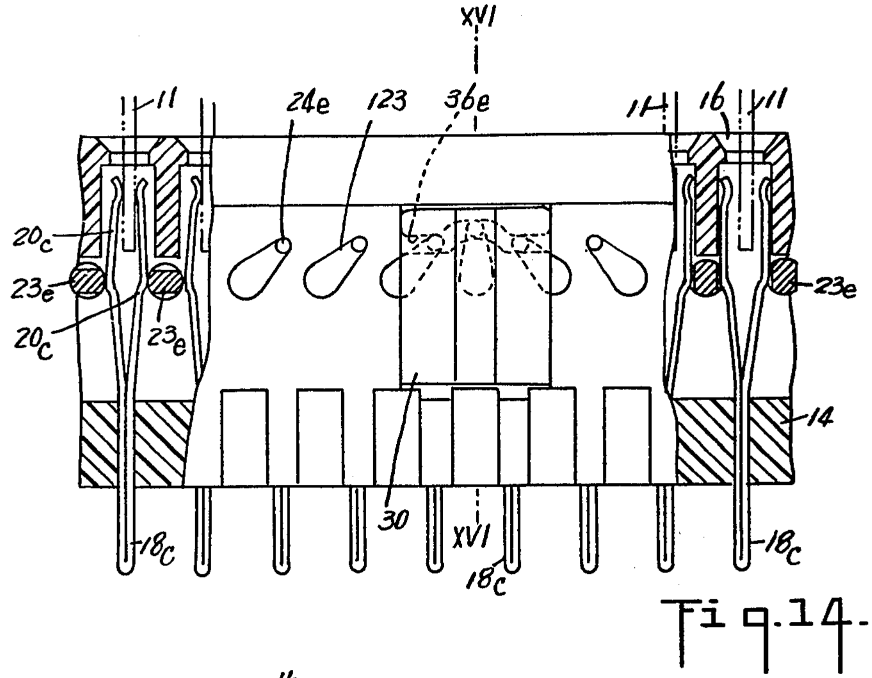
Fig.14.
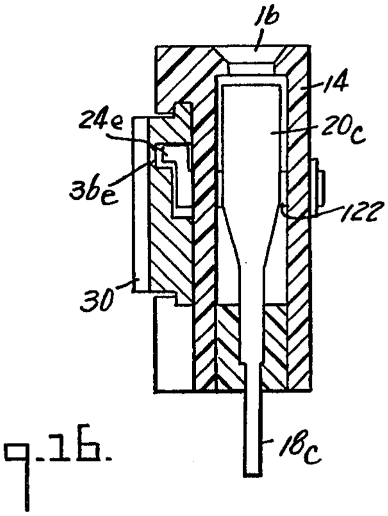
Fig.16.
Fig.15.
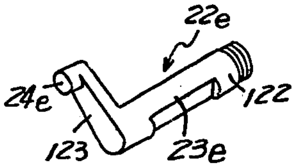
Fig.19.
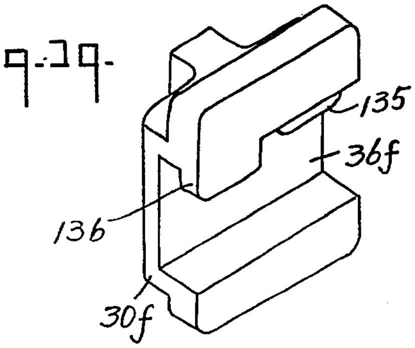

Fig. 23.
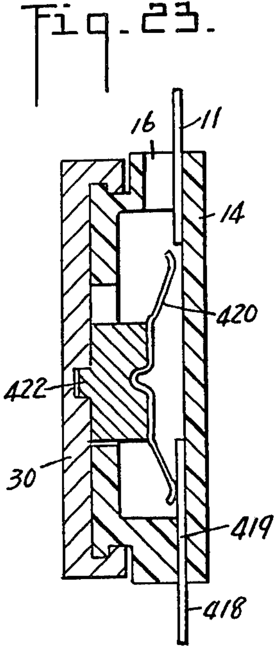
Fig. 24.
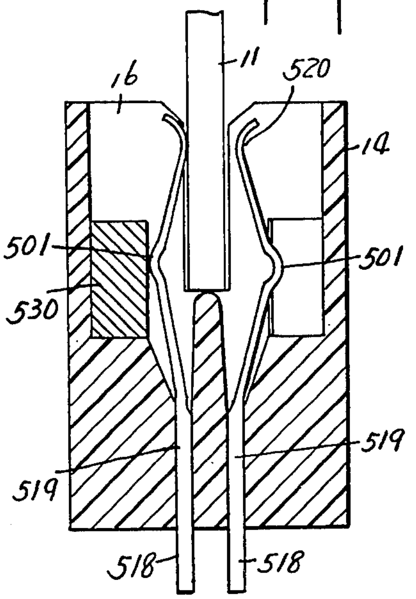
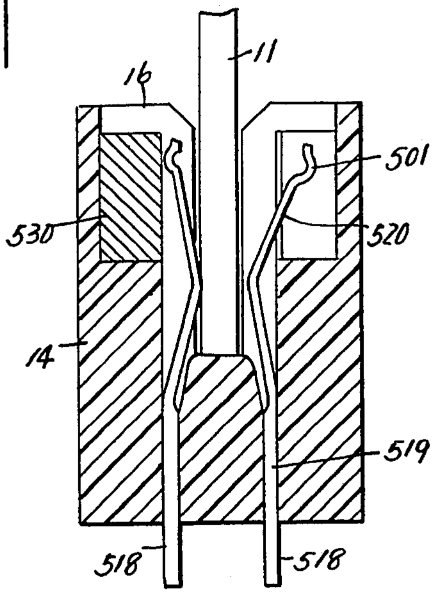
Fig. 25.
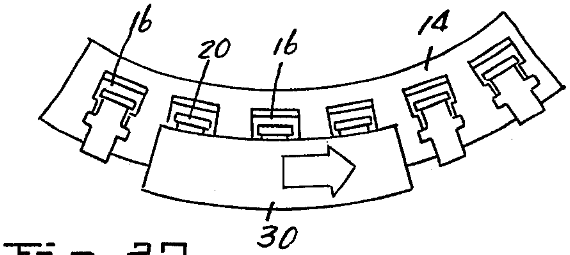
Fig. 27.
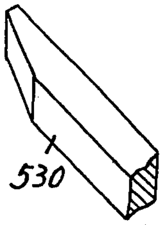
Fig. 26.
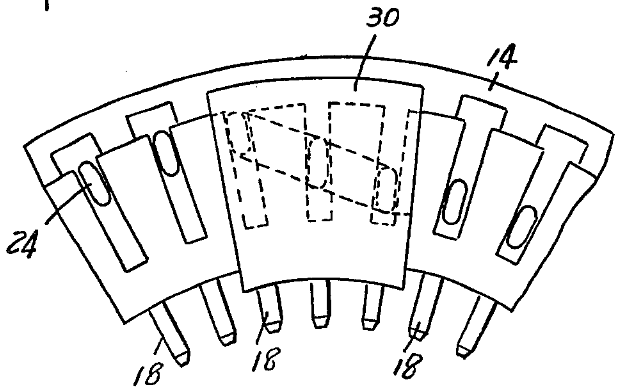
Fig. 28.

CONTACT DRIVER

BACKGROUND OF THE INVENTION

This invention generally relates to electric connectors or switches. Particularly it relates to an apparatus which is capable of driving a series of movable terminals or contacts in connectors or switches to bring them into contact with stationary terminals or conductors associated with the movable terminals.

For example, a connector for aging a plurality of elements in an integrated circuit by passing current therethrough for a given period of time before using the elements, or a connector in which a plurality of conductive contacts are consecutively arranged on an insulating plate to connect, for example, printed base plates of an electronic computer to each other, are well known in the art.

In such a connector, an apparatus which is capable of inserting conductive pins or conductors of leads of such printed base plates to be connected, into positions respectively opposite to the conductive contacts of the connector, then bending the contacts so as to electrically connect them to the pins or conductors, is also well known.

When the pins or conductors of the printed base plates are inserted into the connector, since the pins or conductors are not immediately brought into contact with the connector terminals, they can be inserted with a slight insertion force. Therefore, such connectors are generally referred to as "zero insertion force type connectors".

In "zero insertion force type" connectors of the prior art, connection between terminals and pins or conductors has been accomplished by bending the contacts so as to bring them into contact with the pins inserted. Thus, force must be simultaneously applied to all the contacts and particularly a great force is required to connect a large number of terminals to pins.

STATEMENT OF OBJECTS

The primary object of the present invention is to provide an apparatus which is capable of easily and accurately driving a series of contacts or terminals arranged in connectors.

It is an object of the present invention to provide a connector or switch which is arranged to drive a plurality of movable contact terminals in consecutive order.

Another object of the present invention is to provide an apparatus which is capable of easily driving a plurality of terminal series and holding them accurately in their positions after driven despite the number of the terminals.

A further object of the present invention is to provide a contactor which is capable of easily driving a plurality of terminal series.

A still further object of the present invention is to provide a contact driver which is simple in construction and easy to operate.

It is also an object of the present invention to provide a contact driver which is reliably operable and capable of preventing errors in operation.

BRIEF DESCRIPTION OF THE DRAWINGS

The following and other objects as well as the novel features of the present invention will more fully appear from the following description of the preferred embodiments of the present invention with reference to the accompanying drawings in which the present invention is shown as electric connectors for convenience. The like reference numerals used in the drawings respectively designate corresponding parts in the several views.

In the accompanying drawings,

FIG. 1 is a partial perspective view of the first embodiment of the contact driver of the present invention;

FIG. 2 is a front view of the apparatus shown in FIG. 1;

FIG. 3 is a sectional view taken along line III—III in FIG. 2;

FIG. 4 is a sectional view taken along line IV—IV in FIG. 2;

FIG. 5 is a perspective view of a preferred embodiment of the guide channel in a slider;

FIG. 6 is a perspective view of another preferred embodiment of the guide channel in a slider;

FIG. 7 is a perspective view of a slider provided with a projection;

FIG. 8 is a schematic front view of a contact driver using the slider shown in FIG. 7;

FIG. 9 is a sectional view of a connector of another type using a cam member;

FIG. 10 is a sectional view showing the second embodiment of the connector of the present invention;

FIG. 14 is a partial front view in section of the fifth embodiment of the connector of the present invention;

FIG. 15 is a perspective view of a cam member used in the connector shown in FIG. 14;

FIG. 16 is a sectional view taken on line XVI—XVI in FIG. 14;

FIG. 19 is a perspective view of a slide used in the connector shown in FIG. 17;

FIG. 23 is a sectional view showing a connector of the type having separate terminals;

FIGS. 24 and 25 are sectional views respectively showing the other embodiments of the connector of the present invention having a pair of connector terminals oppositely arranged;

FIG. 26 is a perspective view of a slider used in the connectors respectively shown in FIGS. 24 and 25;

FIG. 27 is a partial plan view showing the present invention embodied in a curved connector; and FIG. 28 is a partial plan view of a segmental connector.

DETAILED DESCRIPTION OF PREFERRED EMBODIMENT

Figure 11:
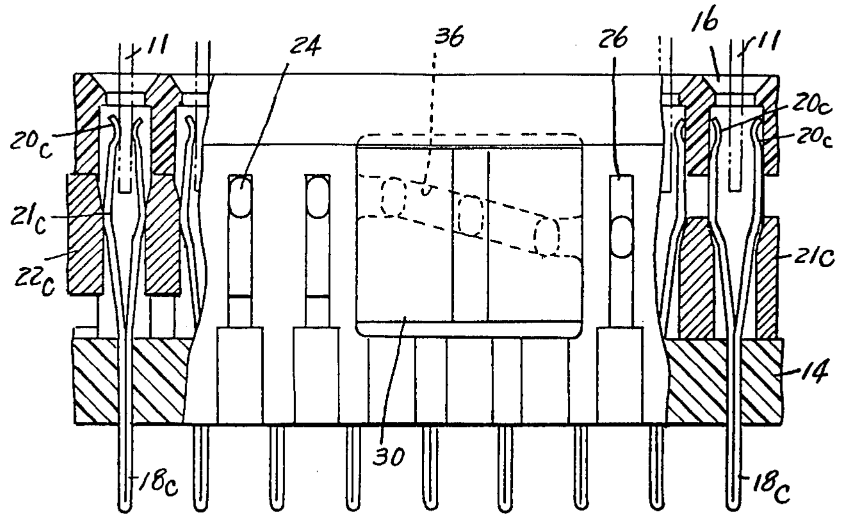
FIG. 11 is a partial front view in section of the third embodiment of the connector of the present invention.

Now the first embodiment of the present invention will be described in detail with reference to the drawings. In the drawings, numeral 10 generally designates a connector comprising a series of male elements 11 and a socket or female component 12.

The socket 12 is formed of a plastic or other dielectric materials so as to provide an elongated integral body 14. The socket 12 is provided wth a series of openings or recesses 16 opened in one end face 15 of the body 14 at regular intervals so as to be suitable to insert a series of the male elements or pins 11 thereinto. These recesses receive a series of electric terminals or contacts 18 respectively and are separated from each other by means of partitions 17.

Each terminal 18 is formed of sheet metal as a single piece and spring-tempered so as to provide a movable terminal of a resilient or flexible member in the form as shown in FIG. 1. The terminal 18 has a base 19 fixedly secured to the body 14 by any suitable means and outwardly extended to a certain degree from the other end face of the body 14. Furthermore, the terminal 18 is forewardly slanted from the base 19 relative to its longitudinal axis and is terminated in a contact portion 20 at its tip end.

To each recess 16 in the body, a cam member 22 having a cam face 21 which cooperates with the terminal 18 is mounted. The cam member 22 also has a projection 24 on the opposite side of the cam face 21, said projection 24 being outwardly protruded from a guide channel 26 formed in one side face 25 of the body 14.

A slider 30 is mounted to the body 14 so that it is slidable longitudinally along the side face 25 of the body 14. For this purpose, the partitions 17 of the body are provided respectively with notches 31 while a guide channel 32 is formed in the opposite side face of the body so that hooks 34 of the slider 30 engage with the notches and the guide channel 32 respectively.

As shown in FIG. 5, the slider 30 is formed with an inclined channel 36 in the side facing to the body 14. This channel 36 in the slider 30 associates with the projections 24 of the cam members 22 and serves to successively move the cam members 22 vertically in guide channels 26 as the slider 30 is moved along the body 14.

Thus as evident by studying FIGS. 3 and 4, after inserting a series of prongs, i.e. male elements 11 into the sockets 12, when the slider 30 is slided to move the cam member 22 from the position shown in FIG. 3 to the position shown in FIG. 4, the movable contacts 20 of the terminals 18 will be brought into contact with the male elements 11 in the socket. On the contrary, when the slider is slided so as to move the cam member 22 from the position shown in FIG. 4 to the position shown in FIG. 3, the movable contacts 20 of the terminals 18 will be disengaged from the male elements 11 in succession.

FIG. 6 is a perspective view of a modification of the guide channel in the slider. As shown in FIG. 6, according to this modification, the slider 30 is provided with an inverted V-shaped channel *36a* in the side facing to the body 14 of the connector. By moving this slider along the body, the terminals 18 may be engaged with or disengaged from the male elements 11 successively. Thus the guide channel in the slider 30 may be of any desirable form.

The guide channel 36 in the slider 30 may be of a rectangular figure formed therein with a projection *24a* as shown in FIG. 7, and an inclined channels *36b* may be formed in each cam member 22 associating with a terminal 18 in the side facing to the slider 30 as shown in FIG. 8. By moving the slide 30 along the body 14, the projection *24a* and its associate inclined channel *36b* in the cam member 22 drive the cam member 22 so as to engage the terminal 18 with or disengage it from the conductor 11.

FIG. 9 shows an embodiment of the present invention in which rotary cam members are employed. As shown in FIG. 9, each cam member *22a* is mounted to the body 14 so that it can be rotated about a shaft 27, the cam face *23b* of the cam member is arranged so that it comes into contact with a particular movable electric terminal 18 and the projection *24b* of the cam members are arranged so that they cooperate with the guide channel in the slider 30. In this embodiment, as moving the slider 30 along the body 14, the projections *24b* of the cam members *22b* successively cooperate with the guide channel in the slider to rotate the cam members about the shaft 27, thus the cam faces 23 serve to engage the movable contacts 20 of the terminals 18 with the male elements or pins 11 or to disengage the contacts 20 from the male elements.

FIG. 10 shows the second embodiment of the connector of the present invention. As shown in FIG. 10, the shape of the electric terminal *18a* in this embodiment clearly differs from the terminal 18 in the first embodiment shown in FIG. 1. Particularly, the terminal *18a* is bent backward at a point *20a* to provide a movable contact. The upper end portion of the terminal *18a* is in turn bent foreward so that it cooperates with the cam member *22a*.

According to this embodiment, since the terminal *18a* serves just as an ends-supporting beam when the movable contact *20a* is in contact with the conductor, i.e. the male element 11, the terminal *18a* presses intensively the male element to insure the contact therewith.

FIG. 11 shows the third embodiment of the contactor of the present invention. In this embodiment, the electric terminal *18c* is bifurcated at its free end. Particularly, the terminal *18c* is generally in Y-shape and the male element 11 is received between the two free ends *20c*.

A cam member *22c* is mounted relative to each of these Y-terminals *18c*. The cam member *22c* is provided with such a cam faces *21c* that as the cam member *22c* moves the terminal *18c* axially, the free movable ends *20c* of the Y-terminal *18c* are closed to tightly hold therebetween the male element 11 inserted through the opening 16 in the body or the movable ends *20c* are opened to release the male element. The structure of the cam member *22c* other than these cam faces *21c* is substantially similar with that of the embodiment described with reference to FIG. 1. Thus the cam member *22c* is also provided with a projection 24 protruding outward from the guide channel 26 formed in one side of the body 14 to cooperate with the guide channel 32 in the slider 30 which is slidable in the longitudinal direction along the side of the body so that the projection 24 may be moved in the guide channel 26.

Another embodiment of the means for driving the free movable ends *20c* of the Y-terminal *18c* to hold or release the male element 11 inserted therebetween will be described with reference to FIGS. 12 and 13.

The driving means comprises cam members **22*d* which are slidable in the axial direction of terminals 18*c* respectively and a slider 30*d* which is movable in the longitudinal direction of the socket body 14**.

Each of the cam members **22*d* is in U-shape having a pair of arms 23*d* which are moved vertically along the opening 16 in the body 14 to close or open the movable ends 20*c* of the Y-terminal 18*c* to hold or release the male element 11 inserted between the movable ends 20*c* in the opening 16. For this purpose, the wall of the body 14 is formed therein with slots 26*d* along the side walls of the openings 16 to extend the arms 23*d* of the cam members 22*d* along the outside of the movable ends 20*c* of the terminals 18*c* through the slots 26*d* and to protrude the coupled portions 24*d* of the cam members 22*d*** in front of the body respectively.

Figure 12:
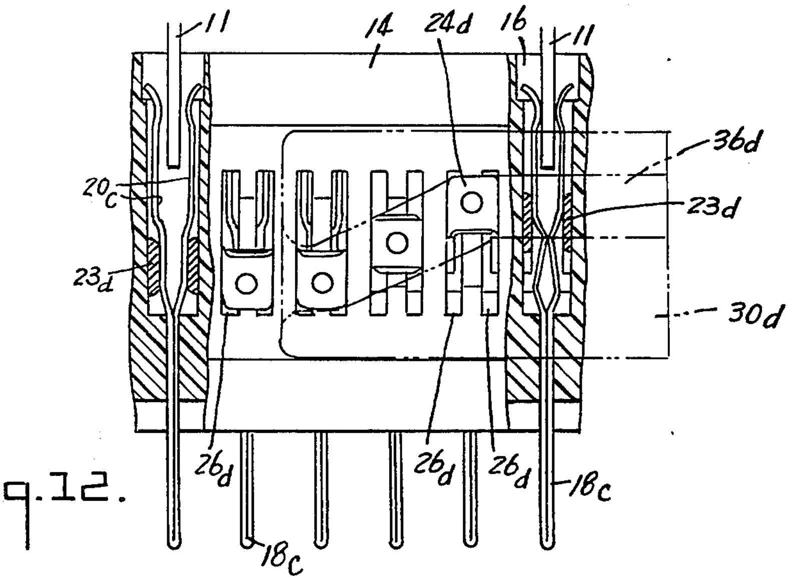
FIG. 12 is a partial front view in section of the fourth embodiment of the connector of the present invention.
Figure 13:
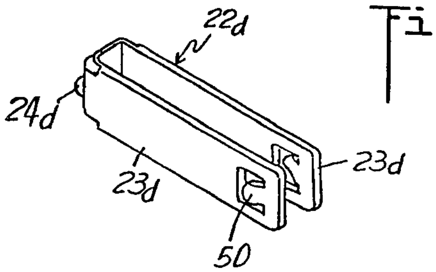
FIG. 13 is a perspective view of a cam member used in the connector shown in FIG. 12.

The slider for driving the cam members **22*d* may be similar in shape with the slider 30 described hereinbefore, however, the length of the slider 30*d* shown in FIG. 12 is substantially equal to or longer than that of the socket body 14 and the guide channel 36*d* thereof for receiving the projections 24*d* of the cam members 22*d* is formed so as to guide the cam members from the open (lower) position of the movable arms 20*c* of the terminals 18*c* to the contact (lower) position and to hold them in the latter position. Preferably, the end of the arm 23*d* of the cam member 22*d* may be provided with a protrusion 50 so as to rotate the cam member 22*d*** about the protrusion.

In this embodiment, as the slider **30*d* is inserted into the sliding channel 32*d* from one end of the socket body 14 and until it is completely received in the sliding channel, all of the cam members 22*e* are moved by the guide channel 36*d* of the slider 30*d* from the open (lower) position to the contact (upper) position and they are held tightly in the latter position. Therefore, unless the slider 30*d* is not moved, the cam members 22*d* continuously hold the movable ends 20*c* of the terminals 18*c*** in the contact position.

Another embodiment of the means for driving the free movable ends **20*c* of the Y-terminals 18*c* is shown in FIGS. 14, 15 and 16**.

In this embodiment, as the cam members for driving the free movable ends **20*c* of the Y-terminals 18*c*, crank-shaped cam members 22*e* shown in FIG. 15 are arranged so as to cooperate with the side faces of the movable ends 20*c* of the terminals 18*c*** respectively.

Each cam member **22*e* comprises a shank 122, a cam face 23*e*, a crank arm 123 and a pin or projection 24*e*. The cam face 23*e* of the round shank 122 is undercut to provide a spherical but nearly elliptic shape in cross section. The cam member 22*e* is mounted to the body 14 in such a manner that its shank 122 may be turned and that the projection 24*e* engages with the guide channel 36*e* in the slider 30. The guide channel 36*e* in the slider 30 is arcuated as shown in FIG. 14, whereby as the slider 30 is moved along the body 14, the cam face 23*e* moves the free movable ends 20*c* of the Y-terminal 18*c* so as to bring them into or out of contact with the male element 11** inserted therebetween.

Another embodiment for driving the free movable ends **20*c* of Y-terminals 18*c* is now described with reference to FIG. 17**.

Figure 17:
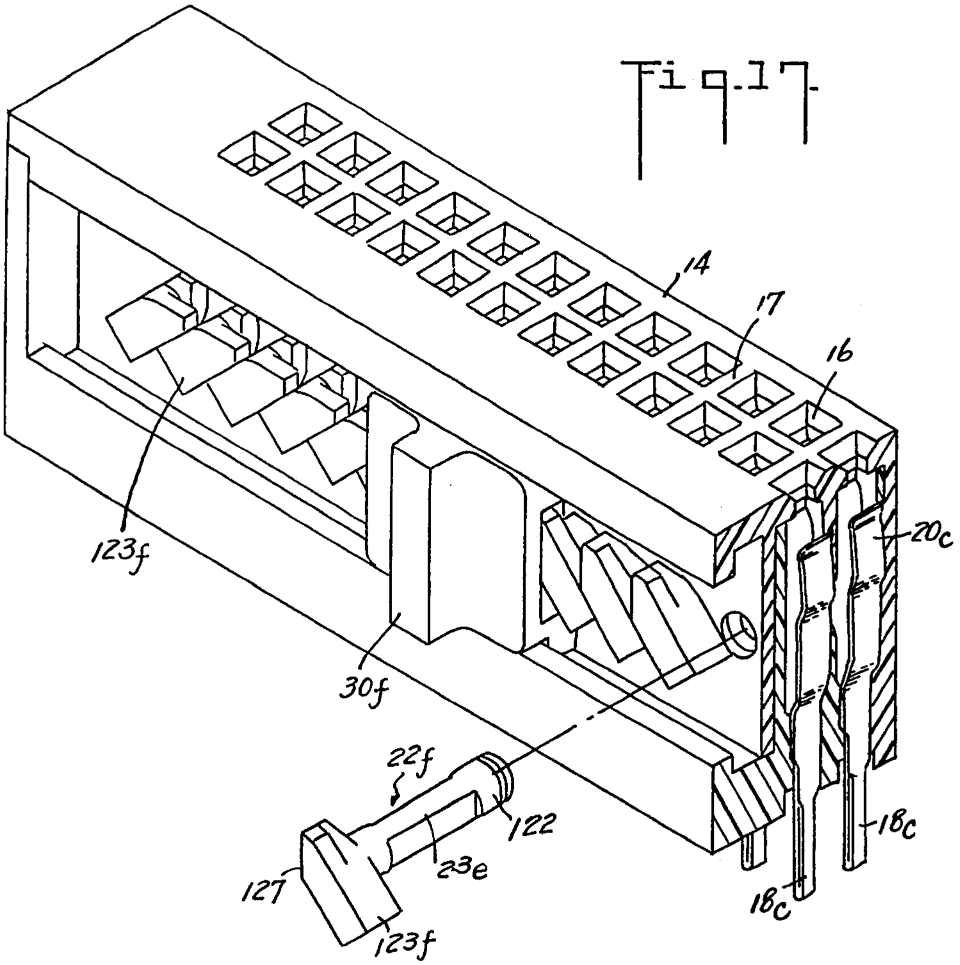
FIG. 17 is a perspective view partially in section of the sixth embodiment of the connector of the present invention.
Figure 18:
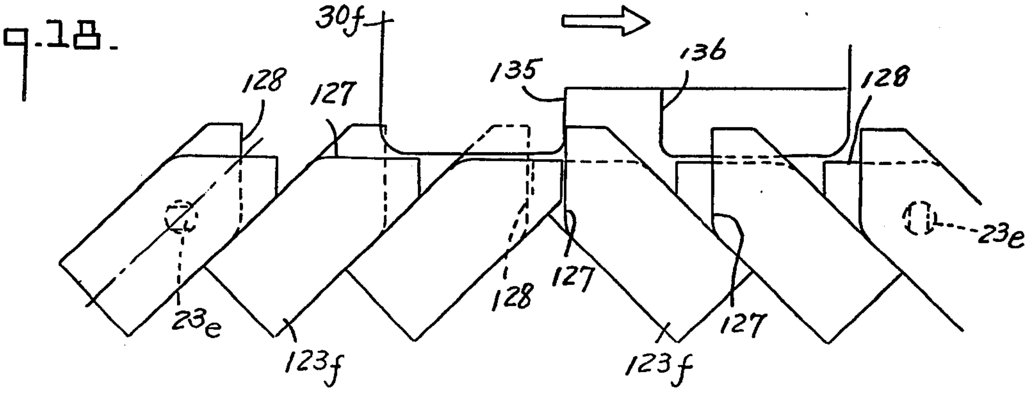
FIG. 18 is a schematic diagram showing the relationship between the cam members and the slide in the connector shown in FIG. 17.

In this embodiment, as the cam members for driving the free movable ends **20*c* of the Y-terminals 18*c*, crank-shaped cam members 22*f* shown in FIG. 17 are arranged so as to cooperate with the side faces of the movable ends 20*c* of the terminals 18*c* respectively. Each cam member 22*f* comprises a shank 122, a cam face 23*e*, and a head 123*f*. The cam member 22*f* is mounted to the body 14 so that its shank 122 can be turned, and the head 123 is shaped as shown in FIG. 18. In other words, the cam member 22*f* is shaped rectangular in general and the top of the head 123 which cooperates with the slider in the manner as will be described hereinafter, is cut so as to provide slant faces 127, 128**.

One slant face 127 is cut at an angle of 45° relative to the plane passing through the longitudinal center line of the rectangular head **123*f*, while the other slant face 128 makes a right angle with the slant face 127. The relationship between the undercut portion of the cam face 23*e* of the cam member 22*e* and the head 123*f* is shown in FIG. 18**.

The slider **30*f* is mounted so that it may be slid in the longitudinal direction of the body 14 along the guide channel 31*f* formed in the front surface of the body 14. In the surface of the slider 30*f* facing to the body 14, a channel 36*f* which is sufficient to receive and pass the head 123*f* of the cam members 22*f* as the slider is moved, is formed (also see FIG. 19). The channel 36*f* is provided with projections 135 and 136 which respectively cooperate with the slant faces 127, 128 of the head 123*f* of the cam member 22*f***.

The projection 135 of the slider **30*f* is situated at a position in which it engages with one slant face 127 of the head 23*f* of the cam member 22*f* while the projection 136 of the slider is situated at a position in which it engages with the other slant face 128** of the head of the cam member.

When the slider **30*f* is moved in the direction indicated by an arrow shown in FIG. 18, the projection 135 of the slider engages with the slant faces 127 of the heads 123 of the cam members 22*f* in regular turn whereby the cam members are respectively turned about the shanks 122 in the clockwise direction to drive the free movable ends 20*c* of the Y-terminals. Whereas when the slider 30*f* is moved in opposite direction, the projection 136 of the slider engages with the slant faces 128 of the heads 123*f* whereby the cam members are turned about their shanks 122 in the counter clockwise direction to liberate the free movable ends 20*c*** of the Y-terminals from the pressure of the cam faces.

As shown in FIG. 18, according to this embodiment, when the heads 123 are in turned state after engaging either with projection 135 or 136 of the slider **30*f***, they remain in side by side relation and they will never turn freely relative to each other.

Figure 20:
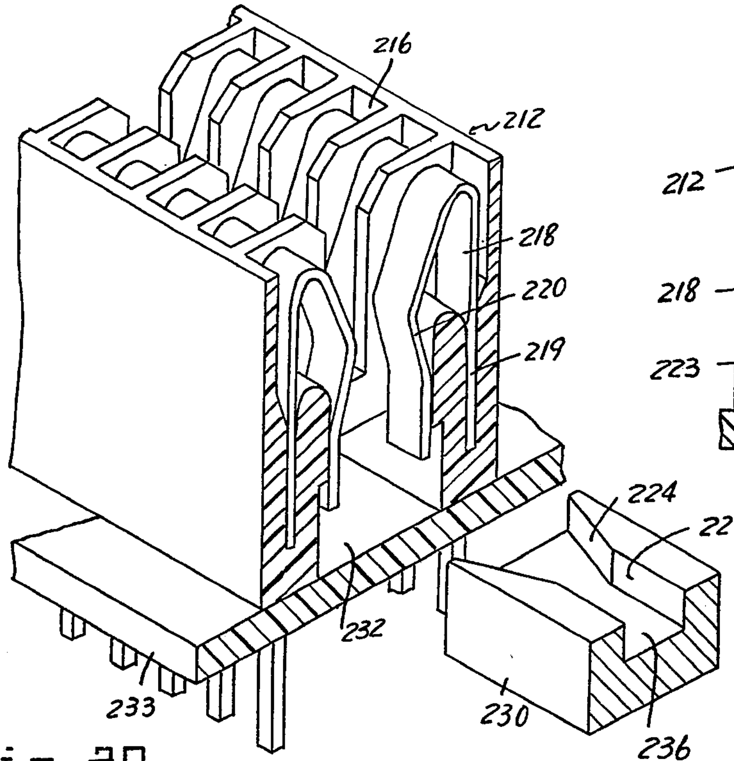
FIG. 20 is a perspective view partially in section of another embodiment of the connector of the present invention in which U-terminals are used.
Figure 21:
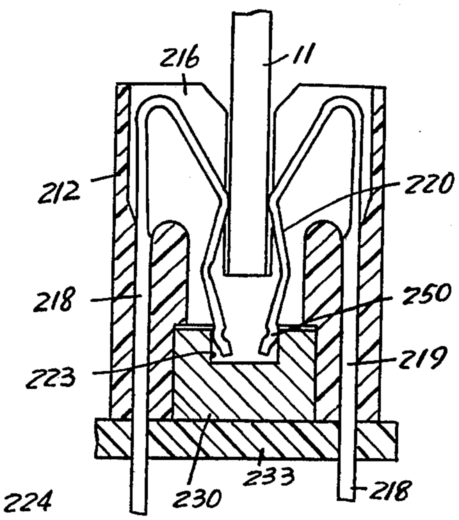
FIG. 21 is a sectional view showing the engagement of a slider with a terminal after inserting the slider to the connector shown in FIG. 20.

FIGS. 20 and 21 show another basic embodiment of the connector of the present invention. In this embodiment, each of spaced openings 216 opened in one end face of the socket 212 of the connector is provided with a pair of terminals 218 formed of a conductive flexible material. Each terminal 218 is U-shaped as shown in FIGS. 20 and 21, and its one arm 219 is fixedly secured to the socket 212 by any suitable means while the other arm 220 thereof constitutes a free movable end. A male element can be inserted in between the movable ends 220 of the terminals 218 without contacting it with their movable ends.

The sides of the socket 212, to which the terminals 218 are mounted, are opened so as to form a recess or channel 232 extending through the socket longitudinally and a part of the free movable end 220 of each terminal 218 is extended into the channel 232. The bottom of the channel 232 is closed with a base plate 233. A slider 230 is inserted into the passage defined by the channel 232 and the base plate 233 so that the slider 230 may be moved longitudinally along the socket 212.

The slider 230 is formed in its top side with a channel 236 having opposite side walls 223 and divergent cam faces 224.

As the slider 230 is inserted in the channel 232 of the socket 212 from one end thereof, the parts of the movable ends 220 extended in the channel 232 first engage with the cam faces 224 of the slider 230 then further engage with the side walls 233 thereof in turn, whereby pairs of the free movable ends 220, 220 are forced to tend closed so that they will tightly contact with male elements 11 inserted therebetween respectively. For the purpose of reducing friction between the side walls 223, cam faces 224 of the channel 236 in the slider 230 and the free movable ends 220 of the terminals 218, particularly when they are slidably engaged, the extended part of the free movable end 220 of each terminal may be provided with a projection 250.

Figure 22:
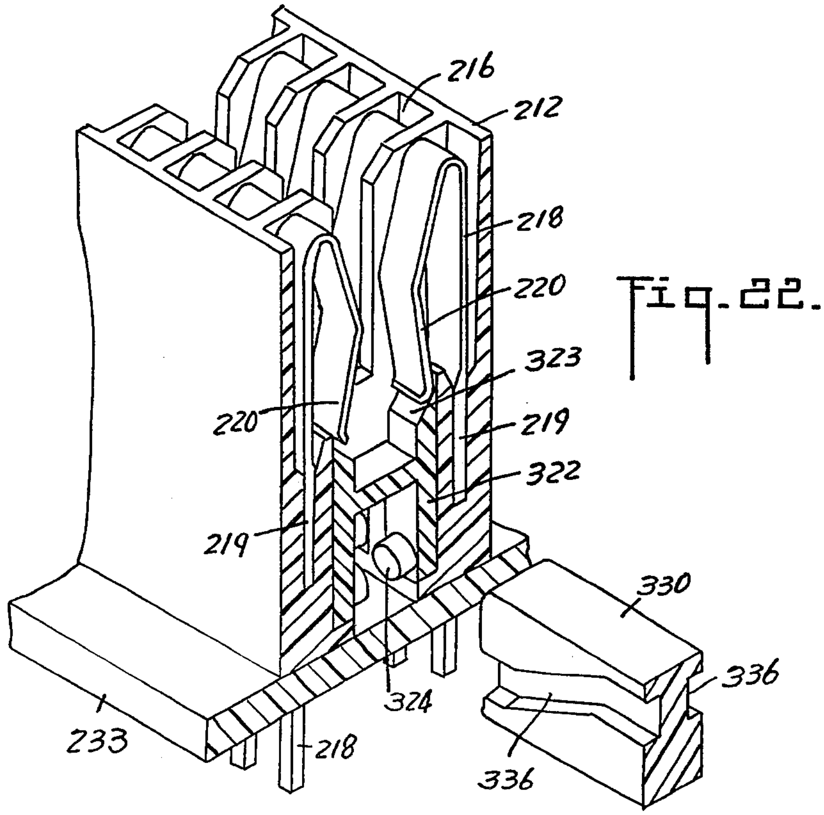
FIG. 22 is a perspective view partially in section of another embodiment of the connector using U-terminals.

FIG. 22 shows another embodiment of the means for driving free movable ends 220 of U-terminals in the connector described with reference to FIG. 20. In this embodiment, since the structure and arrangement of the socket 212, terminals 218, etc. are substantially similar with that described in connection with FIG. 20, description thereof is omitted.

This embodiment includes a number of cam members 322, one per pair of terminals 218, mounted in the passage formed by the socket channel 232 and the base plate 233 and arranged so as to be longitudinally movable in the channel 232. As shown in FIG. 22, each cam member 322 is generally in H-shape having a pair of slant cam faces 323 at the top ends of its legs arranged so as to be divergent.

The legs of the H-cam member 322 are also provided respectively with pins 324 inwardly protruded from the inner walls of the lower ends of the legs respectively. A slider 330 is inserted to a passage defined by the lower parts of the legs so as to be slidable in longitudinal direction of the socket 212.

The length of the slider 330 may be equal to that of the socket 212 or it may be slightly longer than the socket. This elongated slider 330 is formed with guide channels 336, one in one side, which cooperate with the pins 324 of the H-shaped cam member 322.

The guide channels 336 of the slider 330 serve to receive the pins 324 of the H-cam member 322 at a lower position in which the slant cam faces 323 of the cam member 322 are not in engagement with the movable ends 220 of the U-terminals 218, then as the slider is advanced in the passage formed between the lower parts of the legs of the H-cam member 322, the channels 336 push up the H-cam members to force the slant cam faces 323 into engagement with the movable ends 230 of a pair of the terminals 218 to bring them closer to each other so as to tightly hold a male element 11 inserted therebetween. In this manner, the slider 330 can maintain all of the terminals in their elevated positions throughout the socket.

As obvious from the foregoing description, when the slider 330 is completely inserted to the socket 212, all of the terminal pairs are pushed upward by the H-shaped cam members 322 so that they become in contact state with male elements 11 respectively. As the slider 330 is gradually withdrawn from the socket 212, the free movable ends of the terminals are disengaged from the male elements 11 by their spring force in turn.

As shown in FIG. 23, according to the present invention, each of the terminals to be arranged in the socket of a connector may be formed of a stationary portion 419 and a movable portion 420, and as shown in FIG. 1, the movable portion 420 may be moved by a cam member 422 which in turn is moved by the slider 30, so that the terminal 418 is engaged with a male element 11 inserted therebetween through the opening 16 of the socket.

Two modifications, each of which employs an elongated slider 530 for driving free movable ends 520 of a pair of connector terminals 518 placed in an opening 16 of the socket body 14 are shown in FIGS. 24 and 25 respectively.

As evident from FIGS. 24 and 25, each terminal 518 has an outwardly projected portion 501 in its free end and a base 519 at which it is secured by any suitable means so that the free end 520 is movable. The slider 530 is mounted to the socket so as to be slidable to positions in which it is in contact with the projected portions 501 of the free ends 520 of the terminals 518. As shown in FIG. 26, the slider 530 has a convergent slant face at its front end, thus it may be advanced to a position in which it is in contact with the projected portions 501 of the free ends of the terminals whereby the projected portions 501 are pushed inwardly to tightly hold a male element 11 inserted therebetween.

In FIGS. 24 and 25, the left side of each drawing shows the state in which the slider is inserted and the right side shows the state without the slider.

The present invention is also applicable to connectors comprising a plurality of terminal series arranged in the connector socket body and the body may be curved as shown in FIG. 27 or it may be segmental as shown in FIG. 28.

According to the present invention, since free movable ends of a plurality of terminals arranged longitudinally in a socket body are driven successively by a slider moved longitudinally along the socket body as in the foregoing embodiments, the force necessary to move the sliders is very small and the connectors may be operated accurately.

The present invention has been described in detail hereinabove with reference to a few examples of electric connectors; however, it is understood that the present invention is not limited only thereto but it may also be applicable to electric switches.

It is also understood that since various changes and modifications can be made without departing the spirit and the scope of the present invention as defined in the appending claims, the present invention is by no means limited to the preferred embodiments thereof described hereinabove.

I claim:

1. A contact driver comprising a contact mount formed as a single molding of a dielectric material having a series of recesses, a set of contacts arranged in said recesses of the molding, each of said contacts having a movable end, conductors arranged in positions in which the conductors remain out of contact with said contacts in said recesses of the molding, a plurality of cam members adapted to be driven separately from each other and mounted to said molding so as to cooperate with said contacts respectively, and a slider longitudinally slidable along said molding whereby to operate said cam members in regular succession so as to move the movable ends of said contacts to relative positions in which the movable ends are in contact with said conductors.

2. A contact driver as claimed in claim 1, wherein each of said contacts comprises a base rigidly secured to said molding and a movable end extending from said base.

3. A contact driver as claimed in claim 1, wherein said cam members are respectively moved along the longitudinal axis of said contacts.

4. A contact driver as claimed in claim 1, wherein said cam members are rotary disc cams.

5. A contact driver as claimed in claim 1, wherein said slider is provided with a guide channel or channels cooperating with said cam members.

6. A contact driver as claimed in claim 1, wherein each of said contacts comprises a base rigidly secured to said molding and a bifurcate movable end extending from said base.

7. A contact driver as claimed in claim 6, each of said cam members is made rotatable on the side of the bifurcate movable end extending from the base of each contact.

8. A contact driver as claimed in claim 1, wherein a pair of contacts are arranged in each of said recesses formed in said molding.

9. A contact driver as claimed in claim 8, wherein each of said pair of contacts arranged in each recess in the molding comprises a base secured to said molding and a movable end curved in U-shape relative to said base.

10. A contact driver as claimed in claim 1, wherein said cam members are formed integral with said slider.

11. A contact driver as claimed in claim 1, said driver is formed as an arc of a circle in general.

12. A contact driver as claimed in claim 1, wherein said driver is formed as a segment of a circle in general.

* * * * *